(12) United States Patent
Izumi

(10) Patent No.: US 6,323,556 B2
(45) Date of Patent: *Nov. 27, 2001

(54) INTERCONNECT STRUCTURE OF SEMICONDUCTOR DEVICE

(75) Inventor: Katsuya Izumi, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/440,710

(22) Filed: Nov. 16, 1999

(30) Foreign Application Priority Data

Nov. 17, 1998 (JP) .................................. 10-326913

(51) Int. Cl.[7] .................................................. H01L 23/48
(52) U.S. Cl. ............................................ 257/758; 257/48
(58) Field of Search ........................... 257/758, 48, 750, 257/784; 174/262

(56) References Cited

U.S. PATENT DOCUMENTS

| | | | |
|---|---|---|---|
| 5,760,429 | * 6/1998 | Yano et al. | 257/758 |
| 5,763,936 | * 6/1998 | Yamaha | 257/758 |
| 5,773,892 | * 6/1998 | Morikawa et al. | 257/758 |
| 5,866,920 | * 2/1999 | Matsumoto | 257/758 |
| 5,874,779 | * 2/1999 | Matsuno | 257/758 |
| 5,929,525 | * 7/1999 | Lin | 257/758 |
| 5,929,528 | * 7/1999 | Kinugawa | 257/758 |
| 6,016,000 | * 1/2000 | Moslehi | 257/522 |
| 6,031,257 | * 2/2000 | Noto et al. | 257/202 |
| 6,100,573 | * 8/2000 | Lu et al. | 257/508 |
| 6,130,449 | * 10/2000 | Matsuoka et al. | 257/296 |

* cited by examiner

*Primary Examiner*—Eddie Lee
*Assistant Examiner*—Lourdes Cruz
(74) *Attorney, Agent, or Firm*—Sughrue, Mion, Zinn, Macpeak & Seas, PLLC

(57) ABSTRACT

An interconnect structure of a semiconductor device comprising: a semiconductor substrate; a plurality of interconnects including a subject interconnect; a plurality of interlayer dielectric films disposed between the adjacent interconnects; and a concave or convex portion formed on the surface of the semiconductor device corresponding to the desired portion of the subject interconnect is disclosed. When some deficiency is generated on the subject interconnect, the deficiency can be detected by measuring the corresponding concave or convex portion on the surface of the semiconductor for prompt inspection because the concave or convex portion is connected to the subject interconnect.

14 Claims, 12 Drawing Sheets

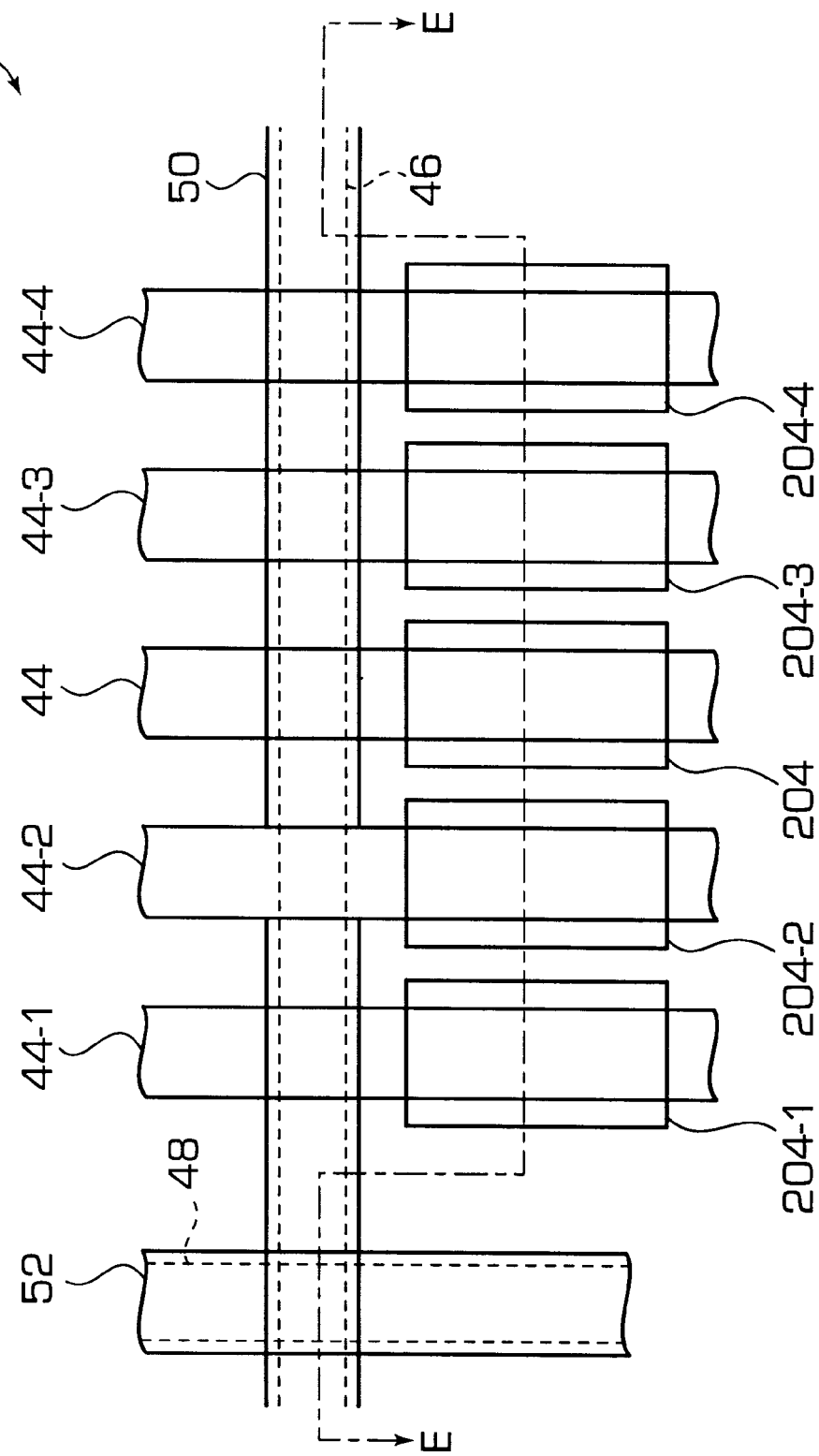

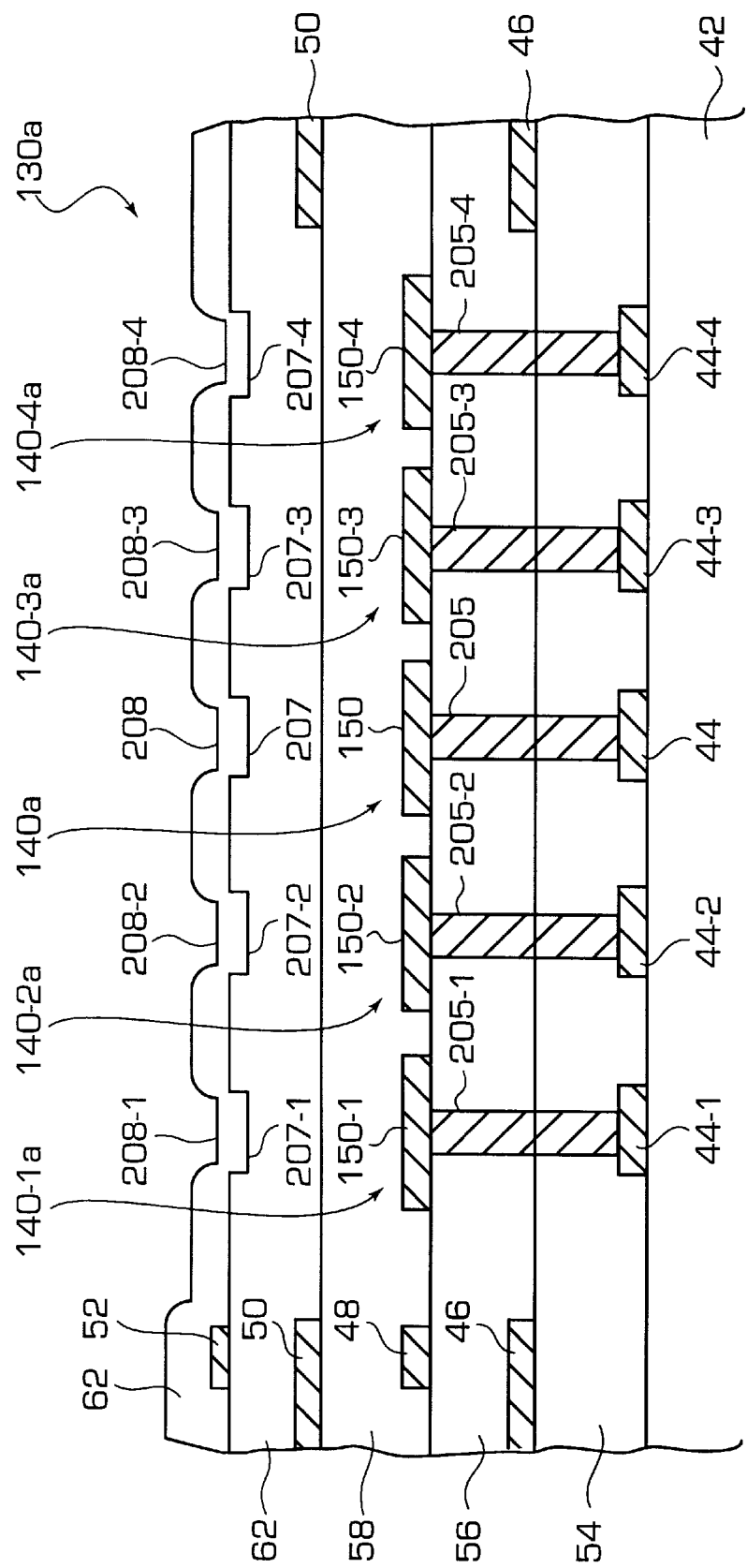

INTERCONNECT STRUCTURE OF SEMICONDUCTOR DEVICE

BACKGROUND OF THE INVENTION (a) Field of the Invention

The present invention relates to an interconnect structure of a semiconductor device, more in detail, to the interconnect structure of the semiconductor device which can be easily observed when the interconnect structure is inspected by employing an electron beam inspection apparatus.

(b) Description of the Related Art

Since, with development of miniaturization and high integration of a semiconductor device, components of the semiconductor device including its interconnects are miniaturized and complicated, the inspection of the components becomes more and more difficult. Depending on the inspection techniques, the semiconductor device is operated during the inspection, wherein a non-destructive inspection of the components of the semiconductor device is conducted.

An electron beam inspection apparatus (hereinafter referred to as EB tester) is conventionally employed for non-destructive inspection of the components of the semiconductor device under the operation.

The EB tester utilizes the principle that an amount of secondary electrons generated at the position of measurement, the secondary electrons being generated upon irradiation of electron beams on the position of measurement of the semiconductor device under the operation, is proportional to the potential at the position of measurement. In the EB tester known as a non-contact inspection apparatus, the electron beams are irradiated on an interconnect of the semiconductor device to be inspected under vacuum, and a potential or a voltage of the interconnect is measured by means of the energy level of the secondary electrons generated from the irradiated part. The EB tester is frequently employed for inspecting the interior of the semiconductor device.

When, for example, a local damage or destruction is generated on a MOSFET, current is concentrated to the damaged or destructed part to produce a photon, the damaged or destructed part can be specified by detecting the photon by employing the EB tester.

The EB tester measures the amount of the secondary electrons having kinetic energy as low as several electron volts radiated from the position of measurement of the semiconductor device after conversion of the amount of the secondary electrons into a corresponding voltage. The EB tester usually has functions of observing secondary electron images and of measuring waveforms.

The function of observing the secondary electron images includes a function of observing a real time image while irradiating successive beams on the position of measurement of the semiconductor device and another function of observing a stroboscope image while irradiating a primary electron beam. In the function of measuring the waveforms, waveforms are obtained by irradiating a pulse beam having a variable phase to the position of measurement of the semiconductor device for radiation of secondary electrons and measuring the respective phases by employing a feedback loop with a spectrometer.

In the observation, a higher potential region of the secondary electrons obtained by the EB tester is shown as a dark side on a screen and a lower potential region is shown as a bright side, the higher potential region is shown as a high level. In the measurement, if unevenness exists on the surface of the semiconductor device during the observation with the EB tester, a secondary electron image reflecting the unevenness is obtained because the irradiated primary electron undergoes diffused reflection.

The interconnect structure of a semiconductor device is generally multi-layered with the miniaturization and the higher integration of the semiconductor device as shown in FIGS. 1A and 1B.

The interconnect structure 11 shown in FIGS. 1A and 1B includes a first layer subject interconnect 14 overlying an undercoat dielectric film 12 and to be subjected to the measurement. The interconnect structure 11 also includes other first layer interconnects 14-1, 14-2, 14-3 and 14-4 extending parallel to the subject interconnect 14, a second layer interconnect 16 extending perpendicular to and overlying the first layer subject interconnect 14, and a third layer interconnect 18 extending right above, the first layer subject interconnect 14 and having a width larger than that of the first layer subject interconnect 14.

A first interlayer dielectric film 20 is formed between the first layer subject interconnect 14 and the second layer interconnect 16. A second interlayer dielectric film 22 is formed between the second layer interconnect 16 and the third layer interconnect 18, and a protection film 24 is formed on the third layer interconnect 18.

The electron beam is generally directly irradiated to the position of measurement in the EB tester. In this respect, a problem arises that the potential of the first layer subject interconnect 14 or the position of deficiency cannot be specified when the first layer subject interconnect 14 in the above interconnect structure 11 is observed by employing the EB tester.

A first reason is as follows. Since the third layer interconnect 18 having a larger interconnect width overlies the first layer subject interconnect 14 in the multi-layered interconnect structure as shown in FIG. 1B, irradiation of the electron beam from the EB tester on the first layer subject interconnect 14 is blocked by the third layer interconnect 18. Accordingly, the potential of the first layer subject interconnect 14 cannot e correctly measured.

Even when the width of the third layer interconnect 18 is not large, judgement whether the secondary electrons originate from the first layer subject interconnect 14 or the third layer interconnect 18 is difficult, and accordingly, the correct measurement of the first layer subject interconnect 14 cannot be conducted similarly to the case of the third layer interconnect 18 having the large width.

A second reason is as follows. In the measurement employing the EB tester, the interconnect path under the interlayer dielectric film is monitored by utilizing unevenness of the interlayer dielectric film. However, in the present semiconductor devices, the interlayer dielectric film on the interconnect of the multi-layered structure is generally polished for flattening. This makes it difficult to effectively observe the interconnect covered by the interlayer dielectric film by employing the EB tester.

A third reason is as follows. When another first layer subject interconnect 14-2 has a higher potential, and the first layer subject interconnect 14 and the other first layer sub-interconnects 14-1, 14-3 and 14-4 have a lower potential, the potential of another first layer subject interconnect 14-2 is displayed as a bright side and the potentials of the first layer subject interconnect 14 and the other first layer interconnects 14-1, 14-3 and 14-4 are displayed as a bright side. Since the flattened surface makes it difficult to observe the lower potential interconnects, it is difficult to specify the interconnect from which the bright side originates among the first layer subject interconnect 14 and the first layer interconnects 14-1, 14-2, 14-3 and 14-4.

SUMMARY OF THE INVENTION

In view of the foregoing, an object of the present invention is to provide an interconnect structure of a semiconductor device having a configuration for easy observation by employing an EB tester and easy position identification.

The present invention provides a semiconductor device comprising a semiconductor substrate, a plurality of interconnect layers overlying said semiconductor substrate and including a top interconnect layer, a plurality of interlayer dielectric films each disposed between adjacent two of said interconnect layers, a top dielectric film disposed on said top interconnect layer, said top dielectric film having a plurality of convex or concave portions each disposed substantially right above a portion of a corresponding interconnect of at least one of said interconnect layers.

In accordance with the interconnect structure of the semiconductor device of the present invention, since the concave portion or the convex portion which corresponds to the subject interconnect is formed on the surface of the semiconductor device, the position of the subject interconnect can be easily specified by measuring the concave portion or the convex portion with the EB tester.

Therefore, a defective portion of the semiconductor device can be promptly detected because the state of the interconnect of the semiconductor device under operation can be easily and non-destructively observed with the EB tester.

An extension as used herein includes an extension part, a plug and a relay pad.

The above and other objects, features and advantages of the present invention will be more apparent from the following description.

BRIEF DESCRIPTION OF DRAWINGS

FIG. 5A is a top plan view showing an interconnect structure of a semiconductor device of Embodiment 4.

FIG. 6C is a vertical sectional view showing a modified example of the interconnect structure of FIG. 6B.

PREFERRED EMBODIMENTS OF THE INVENTION

The term "subject interconnect" as used in the present invention means an interconnect to be subjected to measurement of the potential. In the embodiments described hereinafter, the subject interconnect is disposed as a bottom layer interconnect, and the number of the interconnects from the subject interconnect to the uppermost interconnect is not restricted. If, for example, the number of the interconnects is five, the subject interconnect may be a first layer interconnect or a fourth layer interconnect. The material of the subject interconnect is not restricted, and an aluminum metal, a copper metal, an aluminum alloy, a copper alloy and polysilicon may be employed.

Now, the present invention is more specifically described with reference to accompanying drawings.

Embodiment 1

Figure 2A:
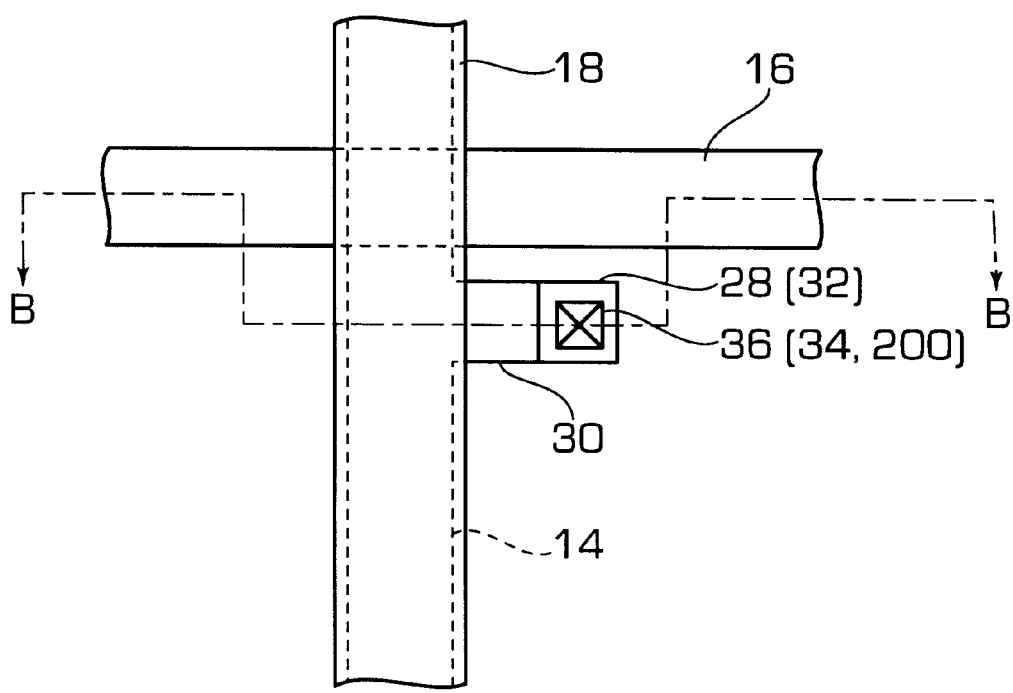
FIG. 2A is a top plan view showing an interconnect structure of a semiconductor device of Embodiment 1.
Figure 2B:
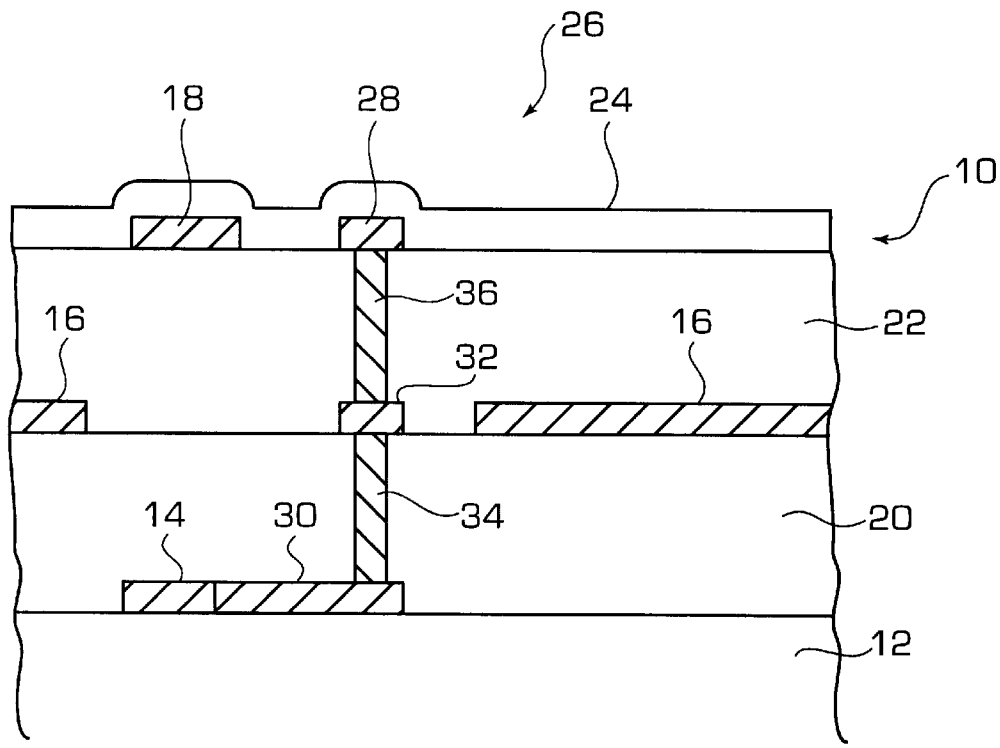
FIG. 2B is a vertical sectional view taken along a line B—B of FIG. 2A.

The interconnect structure 10 of Embodiment 1 shown in FIGS. 2A and 2B includes an undercoat dielectric film 12, a first layer subject interconnect 14 overlying the undercoat dielectric film 12, a second layer interconnect 16 extending perpendicular to and overlying the first layer subject interconnect 14, and a third layer interconnect 18 extending right above the first layer subject interconnect 14 and having a width larger than that of the first layer subject interconnect 14.

A first interlayer dielectric film 20 is formed between the first layer subject interconnect 14 and the second layer interconnect 16. A second interlayer dielectric film 22 is formed between the second layer interconnect 16 and the third layer interconnect 18, and a protection film 24 is formed on the third layer interconnect 18 and the second interlayer dielectric film 22.

Even if the first layer subject interconnect 14 in the interconnect structure 10 of Embodiment 1 is subjected to measurement with an EB tester, the electron beam cannot be efficiently irradiated and the secondary beam is blocked by the third layer interconnect 18 from reaching to the EB tester because the first layer subject interconnect 14 is covered by the third layer interconnect 18.

In order to avoid this disadvantage, a dummy interconnect 26 connected with the first layer subject interconnect 14 penetrates the first and the second interlayer dielectric films 20 and 22 in the interconnect structure 10 of Embodiment shown in FIGS. 2A and 2B. As an inspected part of the first layer subject interconnect 14, an inspection pad 28 is provided on the second interlayer dielectric film 22, which is located apart from the third layer interconnect 18.

As shown in FIG. 2B, the dummy interconnect 26 includes an extension part 30 disposed right below the inspection pad 28, which is branched and extending from the first layer subject interconnect 14, and a relay pad 32 formed on the first interlayer dielectric film 20 right above the extension part 30. The size of the relay pad 32 may be that which can be in contact with the plug. The relay pad is arbitrarily arranged and is formed in a region having a low interconnect density formed on the undercoat interlayer dielectric film. This provides suitable layouts for each of the interconnects of the respective layers.

The relay pad 32 is connected to the extension part 30 through a first plug 34 penetrating the first interlayer dielectric film 20. The inspection pad 28 is connected to the relay pad 32 through a second plug 36 penetrating the second interlayer dielectric film 22.

The extension part 30 is made of the same material, for example, an aluminum alloy as that of the first layer subject interconnect 14 and is formed therewith in the same interconnect formation step, so is the relay pad 32 as that of the second layer interconnect 16, and so is the inspection pad 28 as that of the third layer interconnect 18.

In accordance with the interconnect structure 10 of Embodiment 1, the measurement of the potential or voltage of the first layer subject interconnect 14 which has been difficult to perform in the conventional semiconductor device can be conducted by monitoring the unevenness of the protection layer 24 with the EB tester to observe the inspection pad 28.

Figure 2C:
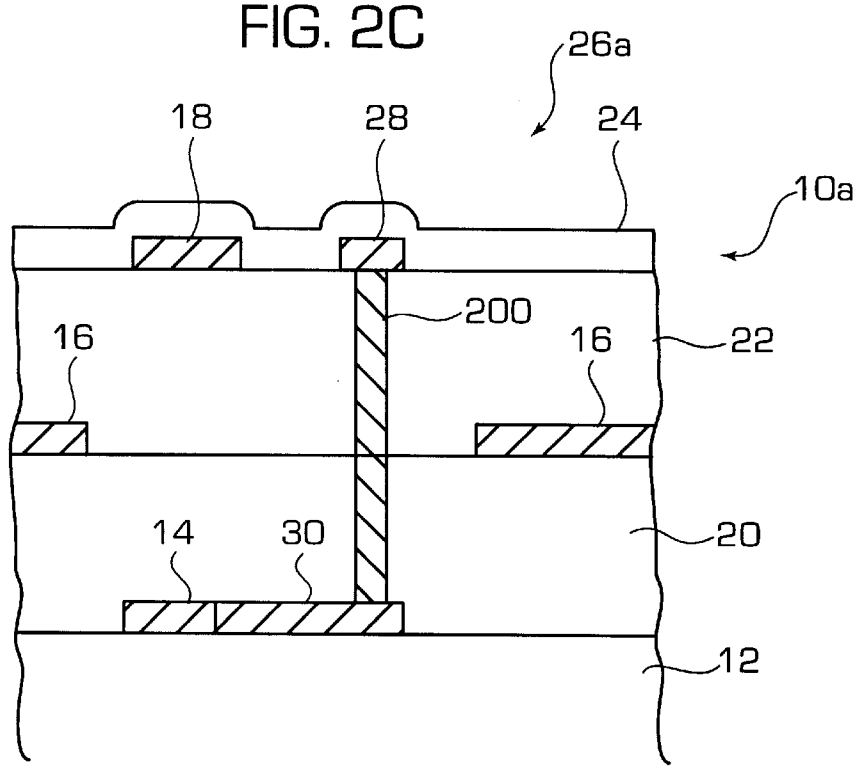
FIG. 2C is a vertical sectional view showing a modified example of the interconnect structure of FIG. 2B.

In a modified structure 10a of Embodiment 1 shown in FIG. 2C having a modified dummy interconnect 26a, the inspection pad 28 and the extension part 30 may be connected with each other by a plug 200 penetrating the first interlayer dielectric film 20 and the second interlayer dielectric film 22 without forming the relay pad. Also in this structure 10a, the interconnect structure having a function similar to that of the structure having the relay pad can be obtained.

Embodiment 2

Figure 3A:
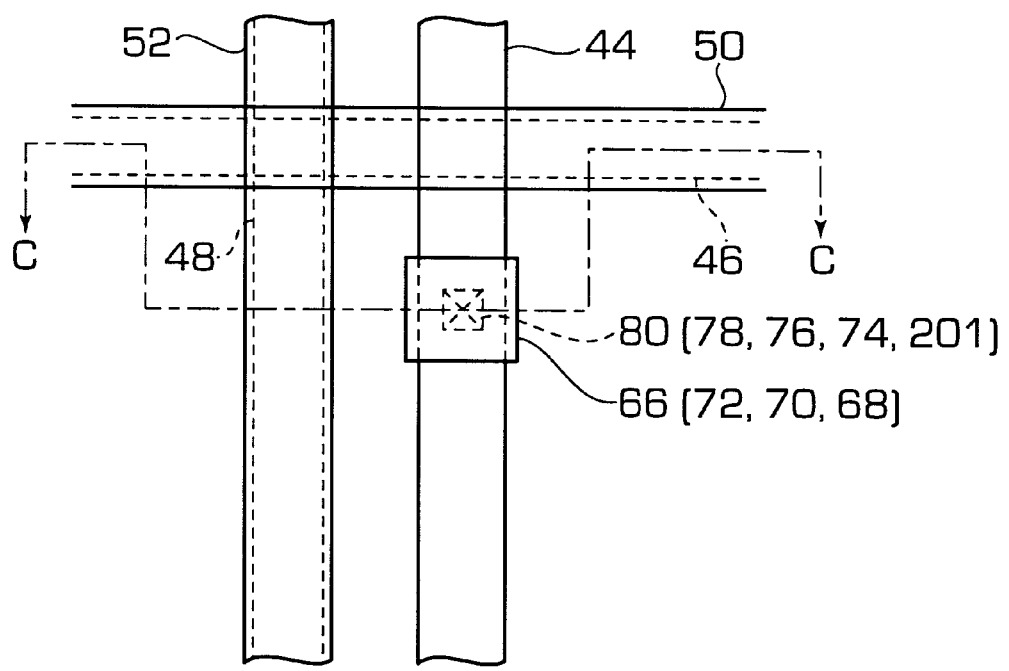
FIG. 3A is a top plan view showing an interconnect structure of a semiconductor device of Embodiment 2.
Figure 3B:
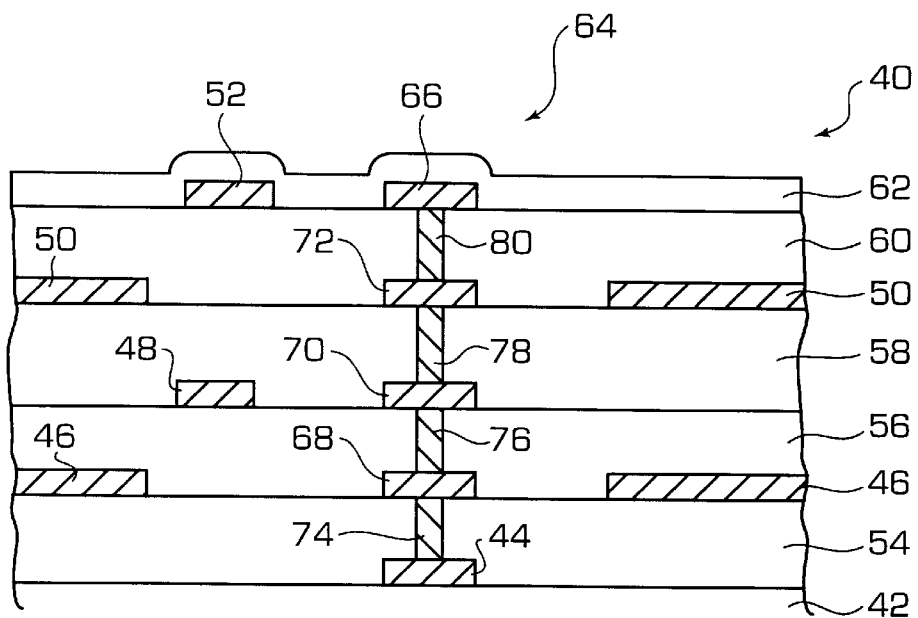
FIG. 3B is a vertical sectional view taken along a line C—C of FIG. 3A.

An interconnect structure 40 of Embodiment 2 shown in FIGS. 3A and 3B includes an undercoat dielectric film 42, a first layer subject interconnect 44 overlying the undercoat dielectric film 42, a second layer interconnect 46 extending perpendicular to and overlying the first layer subject interconnect 44, a third layer interconnect 48 extending parallel to and not right above the first layer subject interconnect 44, a fourth layer interconnect 50 extending parallel to the second layer interconnect 46 and a fifth layer interconnect 52 extending parallel to the third layer interconnect 48.

First, second, third and fourth interlayer dielectric films 54, 56, 58 and 60 are formed between the corresponding adjacent interconnects , and a protection film 62 is formed on the fifth layer interconnect 52.

Even if the first layer subject interconnect 44 in the interconnect structure 40 of Embodiment 2 is observed with the EB tester, existence of the first layer subject interconnect 44 cannot be detected by monitoring the unevenness of the protection layer 62 and the first interlayer dielectric film 54 because the first layer subject interconnect 44 extends deep in the first interlayer dielectric film 54. Accordingly, an electron beam cannot be irradiated.

In order to avoid this disadvantage, a dummy interconnect 64 connected with the first layer subject interconnect 44 penetrates the first to the fourth interlayer dielectric films 54, 56, 58 and 60 in the interconnect structure 40 of Embodiment 2 shown in FIGS. 3A and 3B. As an inspected part of the first layer subject interconnect 44, an inspection pad 66 is present on the fourth interlayer dielectric film 60 right above the first layer subject interconnect 44.

As shown in FIG. 3B, the dummy interconnect 64 has a first relay pad 68 formed on the first interlayer dielectric film 54 right above the first layer subject interconnect 44, a second relay pad 70 formed on the second interlayer dielectric film 56 right above the first relay pad 68, and a third relay pad 72 formed on the third interlayer dielectric film 58 right above the second relay pad 70.

The first layer subject interconnect 44, the first, the second and the third relay pads 68, 70 and 72 are connected to the first, the second and the third relay pad 68, 70 and 72 and the inspection pad 66 immediately above by plugs 74, 76, 78 and 80, respectively.

The relay pads 68, 70 and 72 and the inspection pad 66 may be made of the same interconnect materials, for example, an aluminum alloy as those of the second layer interconnect 46, the third layer interconnect 48, the fourth layer interconnect 50 and the fifth layer interconnect 52, respectively, and these can be formed in the same interconnect formation steps.

In accordance with the interconnect structure 40 of Embodiment 2, the measurement of the potential or voltage of the first layer subject interconnect 44 which has not been performed can be conducted by observing the inspection pad 66 by employing the EB tester.

Figure 3C:
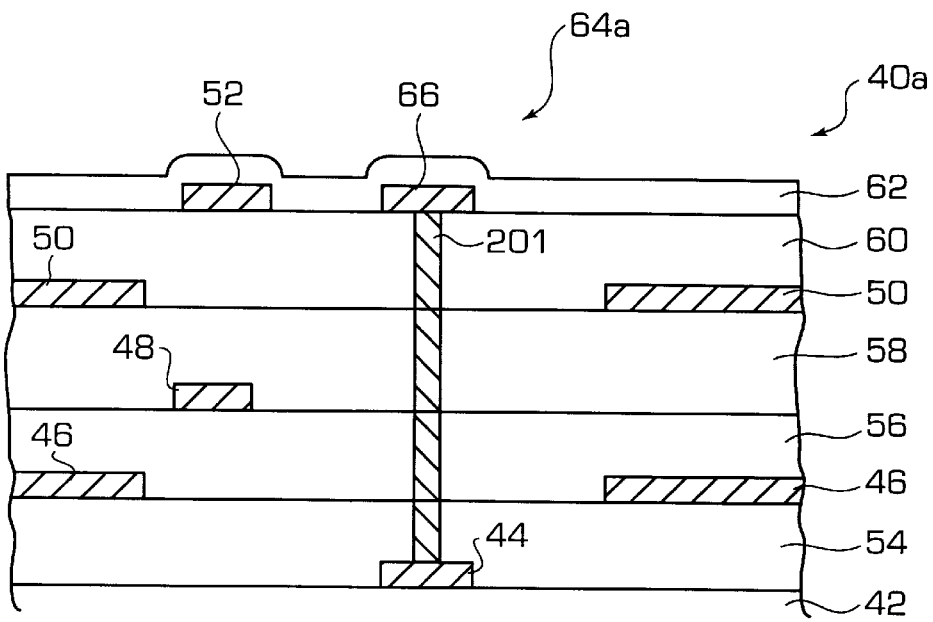
FIG. 3C is a vertical sectional view showing a modified example of the interconnect structure of FIG. 3B.

In a modified structure 40a of Embodiment 2 shown in FIG. 3C having a modified dummy interconnect 64a, the inspection pad 66 and the first layer subject interconnect 44 may be connected with each other by a plug 201 penetrating the first interlayer dielectric film 54, the second interlayer dielectric film 56 and the third interlayer dielectric film 58 and the fourth interlayer dielectric film 60 without forming the relay pad. Also in this structure 40a, the interconnect structure having a function similar to that of the structure having the relay pad can be obtained.

Embodiment 3

Even if an interconnect structure includes the first layer subject interconnect 14, the second layer interconnect 16 and the third layer interconnect 18 similarly to Embodiment 1, Embodiment 1 cannot be sometimes applied thereto. A case in which interconnect densities of the second and the third interconnects are high and the dummy interconnect of Embodiment 1 cannot be formed at a desired position corresponds to the above interconnect structure. Especially, when the number of layers of the interconnects is large, the dummy interconnects 26 and 64 of Embodiments 1 and 2 may be hardly formed.

An interconnect structure of Embodiment 3 can be suitably employed even when the interconnect structures of Embodiments 1 and 2 cannot be applied.

Figure 4A:
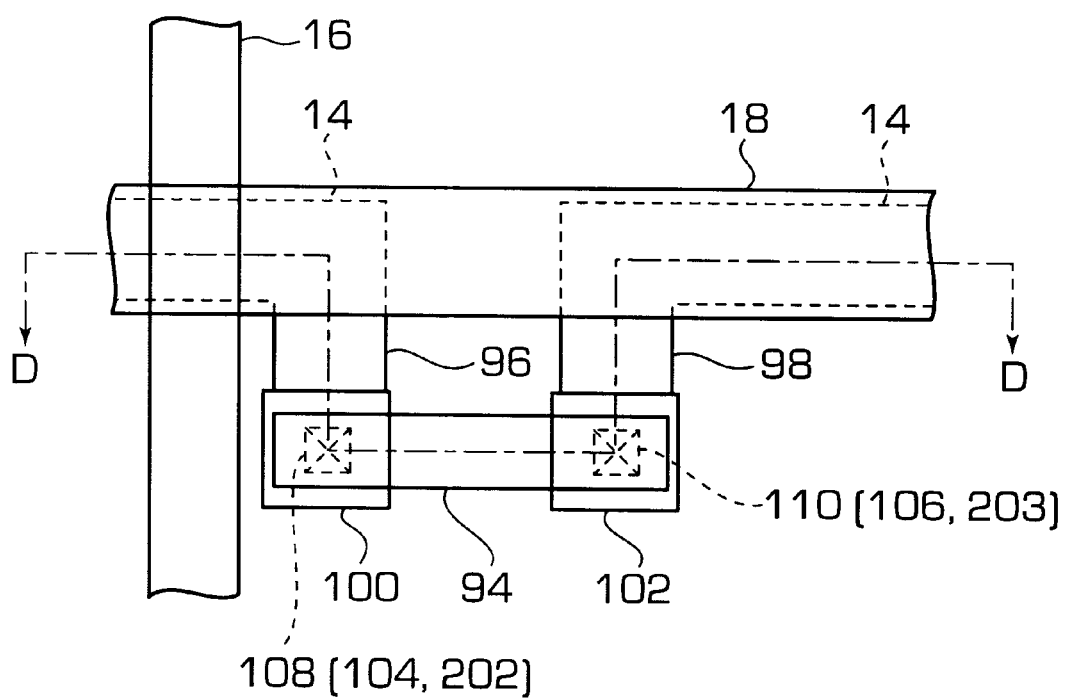
FIG. 4A is a top plan view showing an interconnect structure of a semiconductor device of Embodiment 3.
Figure 4B:
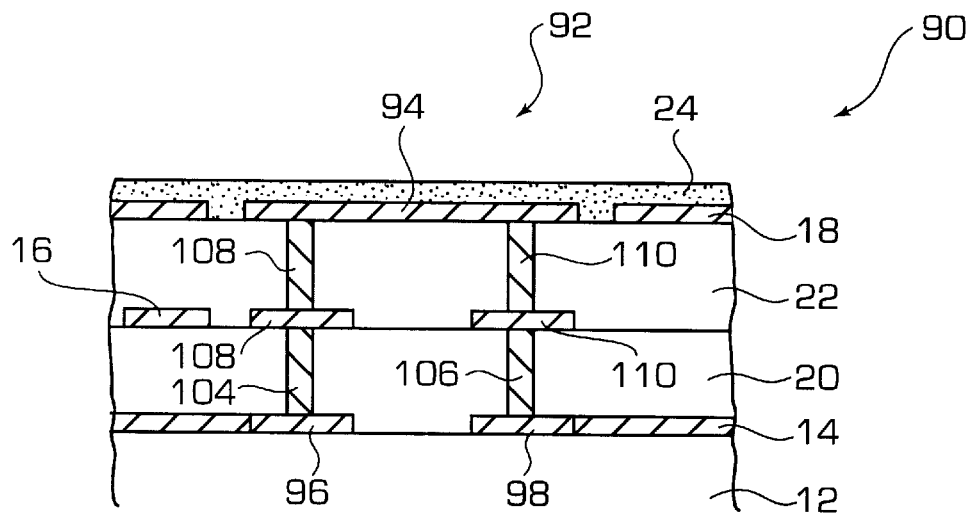
FIG. 4B is a vertical sectional view taken along a line D—D of FIG. 4A.

An interconnect structure 90 of Embodiment 3 shown in FIGS. 4A and 4B includes an undercoat dielectric film 12, a first layer subject interconnect 14 overlying the undercoat dielectric film 12, a second layer interconnect 16 extending perpendicular to and overlying the first layer subject interconnect 14, and a third layer interconnect 18 extending right above the first layer subject interconnect 14 and having a width larger than that of the first layer subject interconnect 14.

A first interlayer dielectric film 20 is formed between the first layer subject interconnect 14 and the second layer interconnect 16. A second interlayer dielectric film 22 is formed between the second layer interconnect 16 and the third layer interconnect 18, and a protection film 24 is formed on the third layer interconnect 18.

Since the first layer subject interconnect 14 is hardly observed with the EB tester in the interconnect structure 90 of Embodiment 3 similarly to Embodiment 1, a dummy interconnect 92 penetrating the first and the second interlayer dielectric films 20 and 22 to pull up part of the first layer subject interconnect 14 onto the second interlayer dielectric film 22. As an inspected part of the first layer subject interconnect 14, an inspection lengthy interconnect 94 is present on the second interlayer dielectric film 22, which is not so near to the third layer interconnect 18.

The dummy interconnect 92 divides the first layer subject interconnect 14 at a required position, and the both opposite portions of the divided first layer subject interconnects 14 are bent at right angles to the same horizontal direction to form two elongated ends 96 and 98 which are then connected to the inspection lengthy interconnect 94 on the second interlayer dielectric film 22.

The dummy interconnect 92 includes relay pads 100 and 102 formed on the first interlayer dielectric film 20 right above the respective elongated ends 96 and 98 of the first layer subject interconnects 14 as shown in FIG. 4B. The relay pads 100 and 102 are connected to the respective elongated ends 96 and 98 of the first layer subject interconnects 14 through two first plugs 104 and 106, respectively. The inspection lengthy interconnect 94 is connected to the relay pads 100 and 102 through two second plugs 108 and 110 penetrating the second interlayer dielectric film 22, respectively.

The relay pads 100 and 102 may be made of the same interconnect material, for example, an aluminum alloy as that of the second layer interconnect 16 and may be simultaneously formed therewith in the same interconnect formation step, and so is the inspection lengthy interconnect 94 as that of the third layer interconnect 18.

In accordance with the interconnect structure 90 of Embodiment 3, the measurement of the potential or voltage of the first layer subject interconnect 14 which has been difficult to perform can be conducted by monitoring the unevenness of the protection layer 24 with the EB tester to observe the inspection lengthy interconnect 94.

Figure 4C:
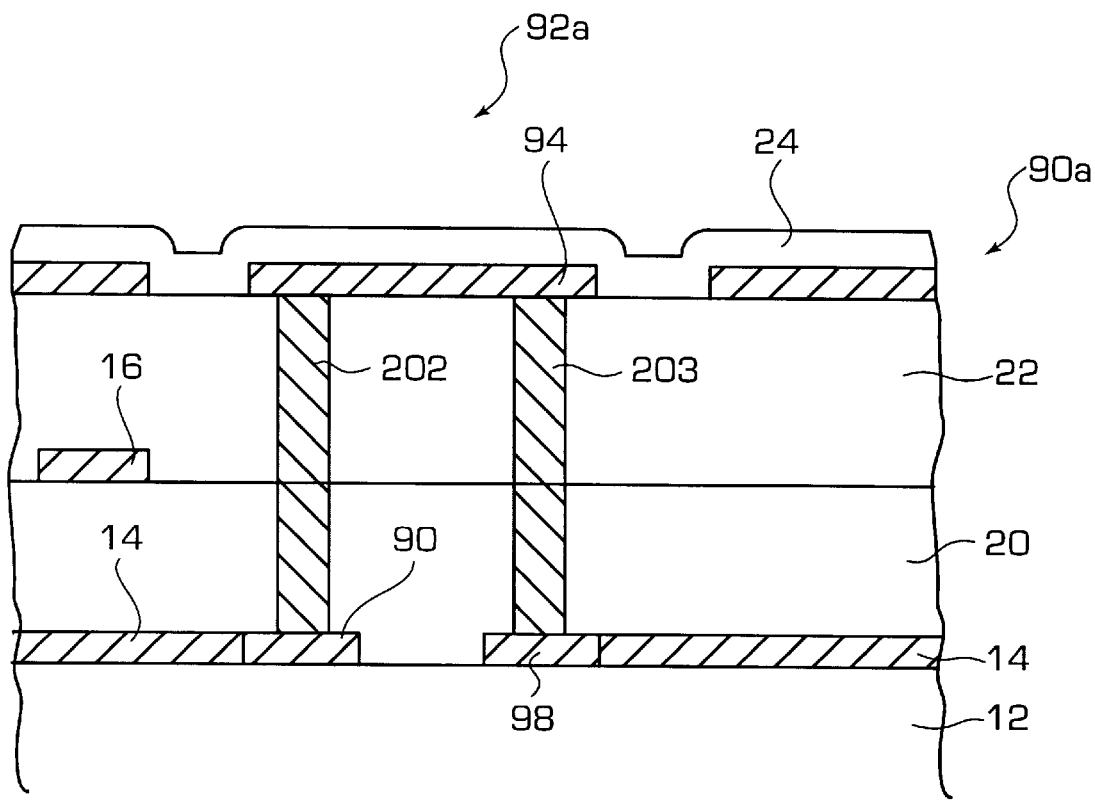
FIG. 4C is a vertical sectional view showing a modified example of the interconnect structure of FIG. 4B.

In a modified structure 90a of Embodiment 3 shown in FIG. 4C having a modified dummy interconnect 92a, the inspection lengthy interconnect 94 and the elongated ends 96 and 98 may be connected with each other by two plugs 202 and 203 penetrating the first interlayer dielectric film 20 and the second interlayer dielectric film 22 without forming the relay pad. Also in this structure 90a, the interconnect structure having a function similar to that of the structure having the relay pad can be obtained.

Embodiment 4

Figure 1A:
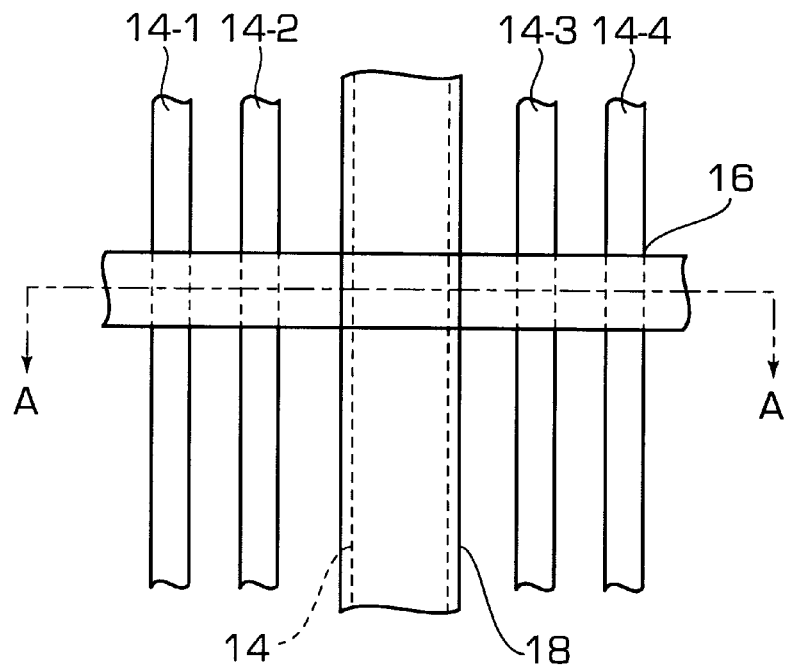
FIG. 1A is a top plan view showing an interconnect structure of a conventional semiconductor device.
Figure 1B:
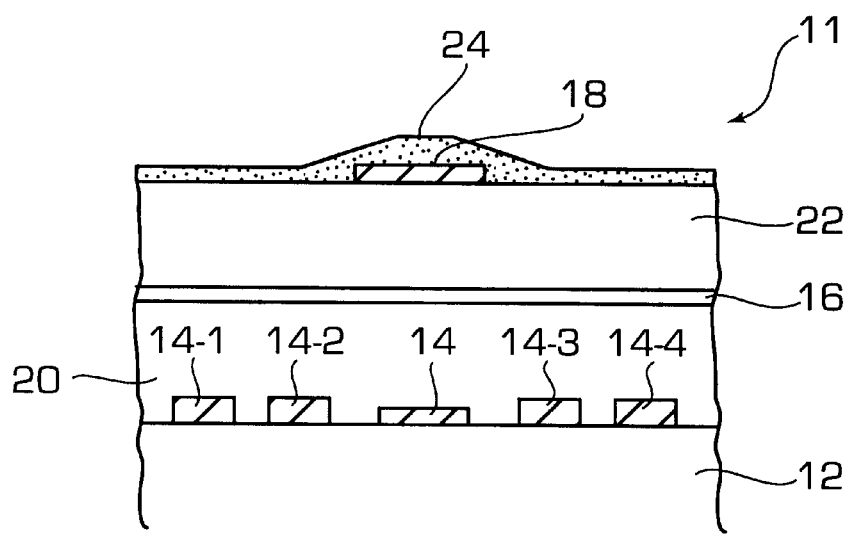
FIG. 1B is a vertical sectional view taken along a line A—A of FIG. 1A.

The parallel first layer interconnects 14, 14-1, 14-2, 14-3 and 14-4 may be densely formed as shown in FIG. 1 in a certain interconnect structure of the semiconductor device in which no interconnects are present right above the five first layer interconnects during the observation with the EB tester. Even if one or more interconnects which are brightly displayed among the five first layer interconnects can be observed, identification which interconnect among the five is brightly displayed is difficult because no unevenness of the surface makes invisible the interconnects darkly displayed.

Embodiment 4 is an interconnect structure responding to the above problem.

Figure 5B:
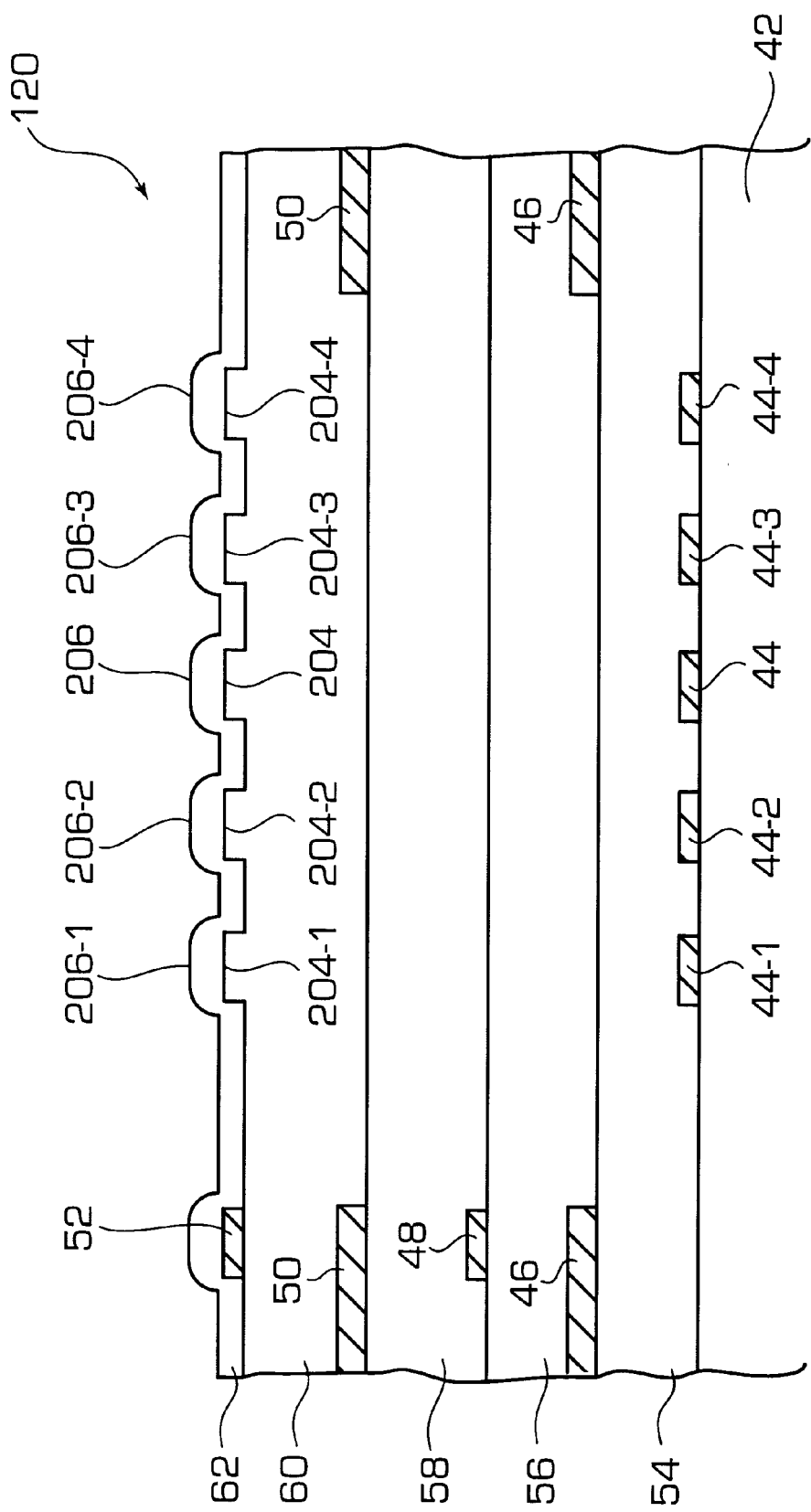
FIG. 5B is a vertical sectional view taken along a line E—E of FIG. 5A.

An interconnect structure 120 of Embodiment 4 shown in FIGS. 5A and 5B includes an undercoat dielectric film 42, a first layer subject interconnect 44 overlying the undercoat dielectric film 42, first layer sub-interconnects 44-1, 44-2, 44-3 and 44-4 extending parallel to the first layer subject interconnect 44, a second layer interconnect 46 extending perpendicular to and overlying the first layer subject interconnect 44, a third layer interconnect 48 extending parallel to the first layer subject interconnect 44, a fourth layer interconnect 50 extending parallel to the second layer subject interconnect 46, and a fifth layer interconnect 52 extending parallel to the third layer interconnect 48.

First, second, third and fourth interlayer dielectric films 54, 56, 58 and 60 are formed between the corresponding adjacent interconnects, and convex portions 204, 204-1, 204-2, 203-3 and 203-4 are formed on the fourth interlayer dielectric film 60 corresponding to the fist layer interconnects 44, 44-1, 44-2, 44-3 and 44-4. A protection film 62 is formed on the fifth layer interconnect 52.

The formation of the convex portions on the fourth interlayer dielectric film 60 makes another convex portions 206, 206-1, 206-2, 206-3 and 206-4 on the surface of the semiconductor device or of the protection film 62 corresponding to the first layer interconnects 44, 44-1, 44-2, 44-3 and 44-4.

Since the positions of the first layer interconnects 44, 44-1, 44-2, 44-3 and 44-4 during the observation with the EB tester can be recognized by the convex portions 206, 206-1, 206-2, 206-3 and 206-4 on the surface of the semiconductor device, identification which interconnect is brightly displayed can be easily performed when one of the five first interconnects are brightly displayed.

Embodiment 5

An interconnect structure of Embodiment 5 can respond to when a problem arises that the potential of the bottom layer interconnect is hardly measured. This problem occurs when the number of the secondary electrons radiated from the bottom layer to be observed is reduced to the excessive small number after the secondary electrons permeates the plurality of the interlayer dielectric films to reach to the surface of the semiconductor device in Embodiment 4.

Figure 6A:
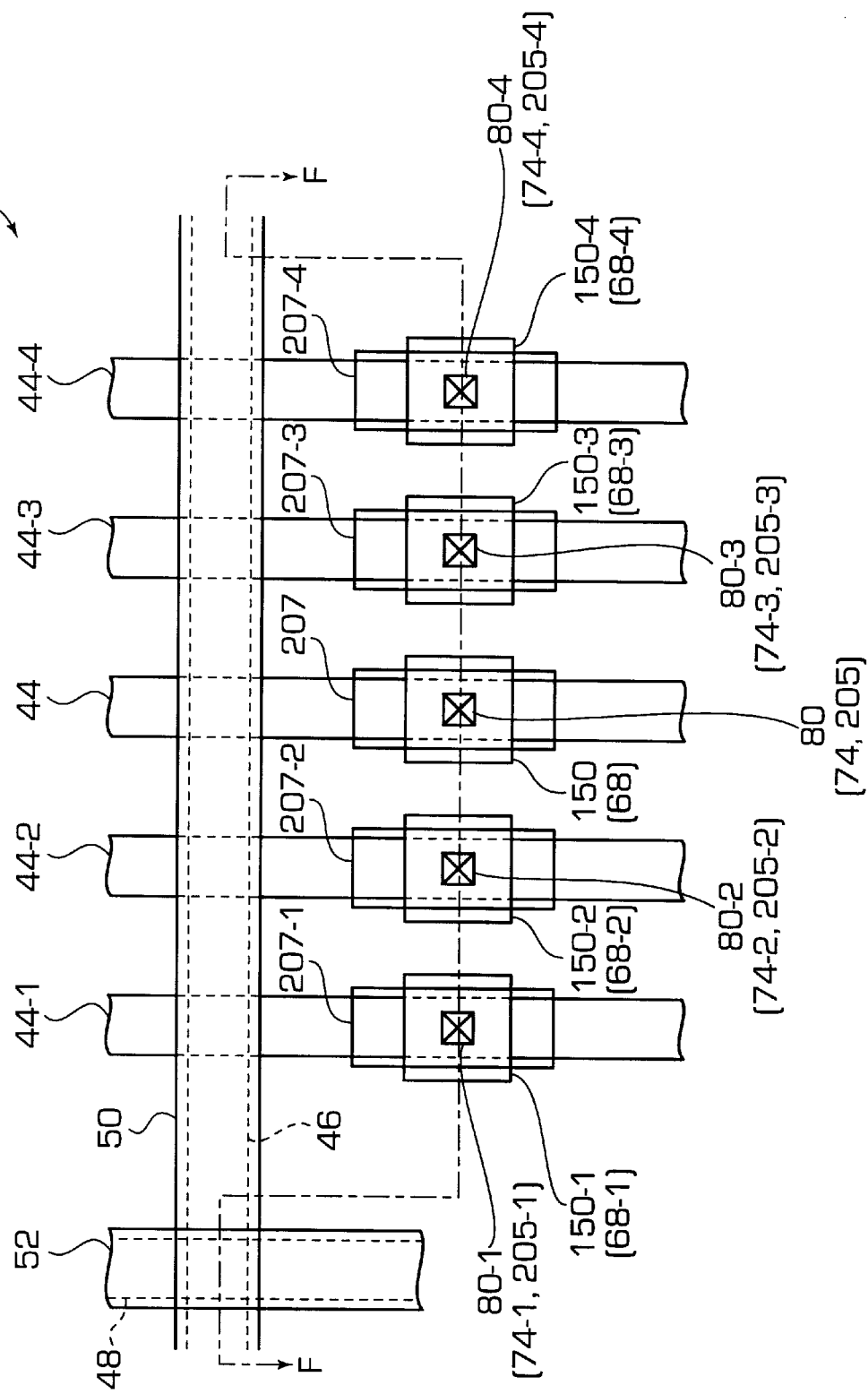
FIG. 6A is a top plan view showing an interconnect structure of a semiconductor device of Embodiment 5.
Figure 6B:
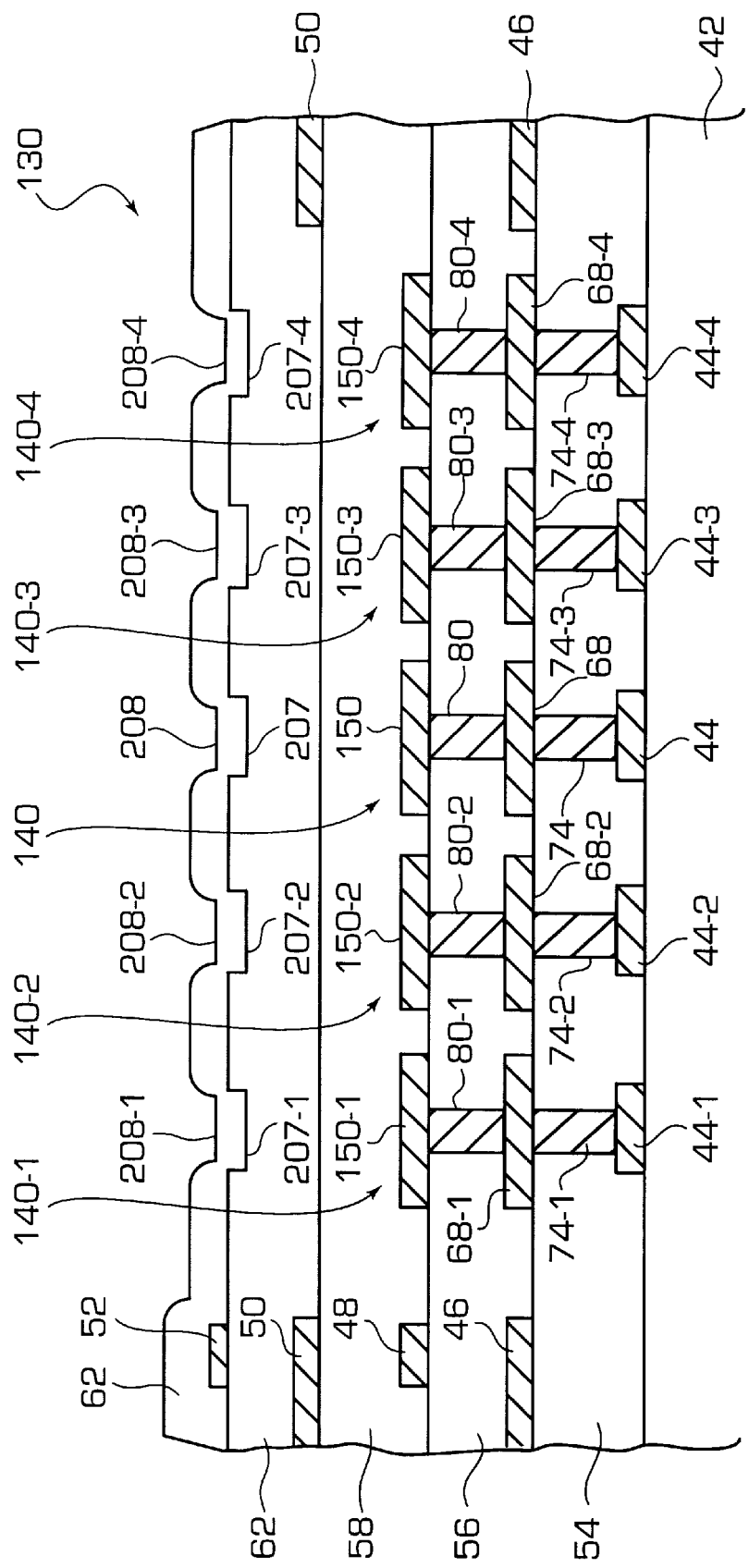
FIG. 6B is a vertical sectional view taken along a line F—F of FIG. 6A

As shown in FIGS. 6A and 6B, the interconnect structure 130 of Embodiment 5 includes dummy interconnects 140, 140-1, 140-2, 140-3 and 140-4 added to the interconnect structure 120 of FIGS. 5A and 5B. The dummy interconnects 140, 140-1, 140-2, 140-3 and 140-4 penetrate first, second, third and fourth interlayer dielectric films 54, 56, 58 and 60 to be connected to first layer interconnects 44, 44-1, 44-2, 44-3 and 44-4, respectively. Inspection pads 150, 150-1, 150-2, 150-3 and 150-4 are formed right above the first layer interconnects 44, 44-1, 44-2, 44-3 and 44-4, respectively, as inspected parts thereof.

The dummy interconnects 140, 140-1, 140-2, 140-3 and 140-4 include first relay pads 68, 68-1, 68-2, 68-3 and 68-4 right above the first layer interconnects 44, 44-1, 44-2, 44-3 and 44-4, respectively.

The first layer interconnects 44, 44-1, 44-2, 44-3 and 44-4 are connected to the first relay pads 68, 68-1, 68-2, 68-3 and 68-4 through first plugs 74, 74-1, 74-2, 74-3 and 74-4, respectively. The first relay pads 68, 68-1, 68-2, 68-3 and 68-4 are connected to inspection pads 150, 150-1, 150-2, 150-3 and 150-4 through second plugs 80, 80-1, 80-2, 80-3 and 80-4.

The first relay pads 68, 68-1, 68-2, 68-3 and 68-4 and the inspection pads 150, 150-1, 150-2, 150-3 and 150-4 may be made of the same interconnect material, for example, an aluminum alloy as those of the second layer interconnect 46 and the third layer interconnect 48, and can be simultaneously formed therewith in the same interconnect formation step.

Since concave portions 207, 207-1, 207-2, 207-3 and 207-4 are formed on the fourth interlayer dielectric film 60 corresponding to the first layer interconnects 44, 44-1, 44-2, 44-3 and 44-4, respectively, in the interconnect structure 130 of Embodiment 5, another concave portions 208, 208-1, 208-2, 208-3 and 208-4 are formed on the surface of the semiconductor device or of the protection film 62 corresponding to the first layer interconnects 44, 44-1, 44-2, 44-3 and 44-4. The concave portions formed on the surface of the semiconductor device have a similar function to that of the convex portions formed on the surface of the semiconductor device in Embodiment 4, that is, the function of easily specify the subject interconnect.

The interconnect structure 130 of Embodiment 5 has an effect of easily distinguish the potential of the subject interconnect to be observed during the observation with the EB tester because the first layer interconnects 44, 44-1, 44-2, 44-3 and 44-4 are shifted to the inspection pads 150, 150-1, 150-2, 150-3 and 150-4 near the surface of the semiconductor device and thereby the reduction of the number of the secondary electrons in the interlayer dielectric film is lowered compared with Embodiment 4.

As shown in FIG. 6C, the inspection pads 150, 150-1, 150-2, 150-3 and 150-4 and the first layer interconnects 44, 44-1, 44-2, 44-3 and 44-4 may be connected with each other by plugs 205, 205-1, 205-2, 205-3 and 205-4 penetrating the first interlayer dielectric film 54 and the second interlayer dielectric film 56 without forming the relay pad. Also in this structure 130a, the interconnect structure having a function similar to that of the structure having the relay pad can be obtained.

In Embodiment 5, the inspection pad can be shifted onto a higher layer, and a structure of connecting the first layer subject interconnect to the inspection pad can be modified to those of Embodiments 1 and 3.

Although the above Embodiments have been described to have the structure including the specified number of the interconnects, the number is not restricted thereto and arrangement of the interconnects is not limited to those of the Embodiments.

Since the above embodiments are described only for examples, the present invention is not limited to the above embodiments and various modifications or alternations can be easily made therefrom by those skilled in the art without departing from the scope of the present invention.

What is claimed is:

1. A semiconductor device allowing easy inspection of an interconnect, said semiconductor device comprising:
    a semiconductor substrate;
    a plurality of interconnect layers overlying said semiconductor substrate having a plurality of individual interconnects therein, including a top interconnect layer, wherein at least one of said plurality of interconnect layers contains an interconnect to be inspected;
    a plurality of interlayer dielectric films each disposed between adjacent two of said plurality of interconnect layers;
    a top dielectric film disposed on said top interconnect layer; and
    a dummy interconnect, said dummy interconnect comprising an inspection pad disposed on one of said interlayer dielectric films adjacent to but not connected with any interconnects in a corresponding interconnect layer and overlying said interconnect to be inspected, and an extension part connected between said inspection pad and said interconnect to be inspected but not connected to any other intervening interconnect.

2. The semiconductor device as defined in claim 1, wherein said top dielectric film has a convex or concave portion disposed substantially above said inspection pad.

3. The semiconductor device as defined in claim 1, wherein said inspection pad and said top interconnect layer are formed as a common layer.

4. The semiconductor device as defined in claim 1, wherein said extension part includes a relay pad disposed on one of said interlayer dielectric films adjacent to but unconnected with any interconnects in a corresponding interconnect layer; between said inspection pad and said interconnect to be inspected.

5. The semiconductor device as defined in claim 4, further comprising an extended portion of the interconnect to be inspected, said extended portion for connecting said interconnect to be inspected to said extension part.

6. A semiconductor device allowing easy inspection of an interconnect, said semiconductor device comprising:
    a semiconductor substrate;
    a plurality of interconnect layers overlying said semiconductor substrate having a plurality of individual interconnects therein, including a top interconnect layer, wherein said plurality of interconnect layers includes a plurality of interconnects to be inspected;
    a plurality of interlayer dielectric films each disposed between adjacent two of said plurality of interconnect layers;
    a top dielectric film disposed on said top interconnect layer; and
    a plurality of dummy interconnects, each said dummy interconnect comprising an inspection pad connected to a corresponding one of said plurality of interconnects to be inspected and a corresponding extension part penetrating said dielectric films, wherein each of said inspection pads of said dummy interconnects is disposed on one of said plurality of interlayer dielectric films adjacent to said top dielectric film and adjacent to but not connected with any interconnects in a corresponding interconnect layer, and said corresponding extension part is not connected to any other intervening interconnect.

7. The semiconductor device as defined in claim 6, wherein said corresponding extension part includes a relay pad disposed on one of said interlayer dielectric films adjacent to but unconnected with any interconnect in a conesponding interconnect layer.

8. A semiconductor device allowing easy inspection of a subject interconnect of an interconnect structure, said semiconductor device comprising:
    an undercoat dielectric film;
    a plurality of interconnect layers overlying said undercoat dielectric film having a plurality of individual interconnects therein, including a top interconnect layer;
    a plurality of interlayer dielectric films each disposed between respective interconnect layers of said plurality of interconnect layers, including a top dielectric film disposed on said top interconnect layer;
    a dummy interconnect connected to a subject interconnect, wherein said subject interconnect is part of one of said plurality of interconnect layers, said dummy interconnect extends upward toward said top interconnect layer through said dielectric films from said subject interconnect for allowing simplified testing of the subject interconnect, and said dummy interconnect is not connected with any other interconnects in any intervening interconnect layer.

9. The semiconductor device according to claim 8, wherein said dummy interconnect comprises, an inspection pad disposed on one of said interlayer dielectric films located above said subject interconnect adjacent to but unconnected with any interconnects in a corresponding interconnection layer, and a conductive plug connectively extending from said inspection pad down to said subject interconnect.

10. The semiconductor device according to claim 8, wherein said conductive plug comprises at least two plug segments, and at least one relay pad connected between said at least two plug segments, wherein said relay pad is disposed on one of said interlayer dielectric films, adjacent to but unconnected with any interconnects in a corresponding interconnection layer, between said inspection pad and said subject interconnect.

11. The semiconductor device according to claim 9, further comprising:

an extension part integrally fomcd with, and in a same plane as, the subject interconnect, wherein said extension part is connected to said conductive plug.

12. The semiconductor device according to claim 10, further comprising:

an extension part integrally formed with, and in a same plane as, the subject interconnect, wherein said extension part is connected to a bottom one of said at least two plug segments.

13. The semiconductor device according to claim 9, wherein said top dielectric film has a convex or concave portion disposed above said subject interconnect for identifying a location of said subject interconnect.

14. The semiconductor device according to claim 10, wherein said top dielectric film has a convex or concave portion disposed above said subject interconnect for identifying a location of said subject interconnect.

* * * * *